United States Patent
Huang

(10) Patent No.: US 10,651,081 B2
(45) Date of Patent: May 12, 2020

(54) SEMICONDUCTOR STRUCTURE AND MANUFACTURING METHOD THEREOF

(71) Applicant: NANYA TECHNOLOGY CORPORATION, New Taipei (TW)

(72) Inventor: Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/138,066

(22) Filed: Sep. 21, 2018

(65) Prior Publication Data

US 2020/0098615 A1    Mar. 26, 2020

(51) Int. Cl.

| | |
|---|---|
| *H01L 21/768* | (2006.01) |
| *H01L 23/532* | (2006.01) |
| *H01L 21/285* | (2006.01) |
| *H01L 27/108* | (2006.01) |

(52) U.S. Cl.
CPC .... *H01L 21/7684* (2013.01); *H01L 21/28556* (2013.01); *H01L 21/76801* (2013.01); *H01L 21/76847* (2013.01); *H01L 21/76877* (2013.01); *H01L 23/5329* (2013.01); *H01L 23/53266* (2013.01); *H01L 27/108* (2013.01)

(58) Field of Classification Search
CPC ......... H01L 21/76801; H01L 21/76847; H01L 21/76877; H01L 23/53266; H01L 23/5329; H01L 21/28556; H01L 21/7684; H01L 27/108

See application file for complete search history.

(56) References Cited

U.S. PATENT DOCUMENTS

2009/0179329 A1* 7/2009 Jeong ................ H01L 21/76834
                                                            257/751
2011/0006429 A1* 1/2011 Liu .................... H01L 21/76831
                                                            257/751

FOREIGN PATENT DOCUMENTS

TW        201739959 A    11/2017

* cited by examiner

*Primary Examiner* — Jasmine J Clark
(74) *Attorney, Agent, or Firm* — Muncy, Geissler, Olds & Lowe, P.C.

(57) ABSTRACT

The present disclosure provides a semiconductor structure and a method for manufacturing the semiconductor structure. The semiconductor structure includes a semiconductor substrate, a dielectric layer, a barrier layer, and a conductive layer. The semiconductor substrate has a plurality of mesas. The dielectric layer is disposed over the semiconductor substrate and has a plurality of blocks disposed over the mesas, respectively. The barrier layer is formed over a first lateral surface of the mesa, a second lateral surface of the block, an upper surface of the semiconductor substrate adjacent to the first lateral surface, and a front surface of the dielectric layer adjacent to the second lateral surface. The conductive layer has a base and a plurality of protrusions extending from the base and in contact with the barrier layer disposed over the upper surface, the first lateral surface, and the second lateral surface. A grain size of the base and the protrusions is consistent.

21 Claims, 6 Drawing Sheets

SEMICONDUCTOR STRUCTURE AND MANUFACTURING METHOD THEREOF

TECHNICAL FIELD

The present disclosure relates to a semiconductor structure and manufacturing method thereof, and more particularly to a dynamic random access memory (DRAM) with a smooth contact surface and a method for smoothing a contact surface of the conductive layer of a DRAM.

DISCUSSION OF THE BACKGROUND

Dynamic random access memory (DRAM) circuits are used extensively in the electronics industry for storing data. Each memory cell consists of a single capacitor and a field effect transistor as a charge transfer transistor.

Currently, the contact plug of the DRAM is formed by chemical vapor deposition (CVD) followed by physical vapor deposition (PVD). Such a two-step process is necessary because severe surface roughness on the upper surface of a conductive surface formed by CVD is difficult to directly pattern using photolithography and etching processes.

However, the two-step process for forming the conductive layer is complicated and expensive, and the grain sizes of the conductive layers formed by PVD and the CVD are different. As a result, the interface between the conductive layers formed by CVD and PVD can easily incur a necking connection and cause high resistance or pattern toppling in the subsequent processes, such as lithography and etching processes.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises a semiconductor substrate, a dielectric layer, a barrier layer, and a conductive layer. The semiconductor substrate has a plurality of mesas. The dielectric layer is disposed over the semiconductor substrate and has a plurality of blocks disposed over the mesas, respectively. The barrier layer is formed over a first lateral surface of the mesa, a second lateral surface of the block, an upper surface of the semiconductor substrate adjacent to the first lateral surface, and a front surface of the dielectric layer adjacent to the second lateral surface. The conductive layer has a base and a plurality of protrusions extending from the base and in contact with the barrier layer disposed over the upper surface, the first lateral surface, and the second lateral surface, and a grain size of the base and the protrusions is consistent.

In some embodiments, the grain size of the conductive layer is substantially in a range of 5 nm to 100 nm.

In some embodiments, the base is in contact with the barrier layer disposed over the front surface.

In some embodiments, a thickness of the barrier layer disposed over the first lateral surface, the second lateral surface, the upper surface, and the front surface is consistent.

In some embodiments, the mesa has a first bottom width and a first upper width less than the first bottom width, the block has a second bottom width and a second upper width less than the second bottom width.

In some embodiments, a slope of the first lateral surface and the second lateral surface is consistent along a vertical direction.

In some embodiments, the base and the protrusions are integrally formed.

In some embodiments, a bottom surface of the barrier layer is lower than a first surface of the semiconductor substrate.

In some embodiments, the conductive layer includes tungsten, the barrier layer includes titanium, and the dielectric layer includes oxide.

Another aspect of the present disclosure provides a method for manufacturing a semiconductor structure. The method comprises providing a semiconductor substrate having a plurality of mesas; disposing a first dielectric layer having a plurality of blocks over the mesas, respectively; disposing a barrier layer at least over an upper surface of the semiconductor substrate, a first lateral surface of the mesa, a second lateral surface of the block, and a front surface of the first dielectric layer; disposing a conductive layer having a plurality of protrusions in contact with the upper surface, the first lateral surface, and the second lateral surface; and a base connected to the protrusions and disposed over the front surface, wherein the base has a rough upper surface; forming a second dielectric layer over the rough upper surface; and removing the second dielectric layer and a portion of the conductive layer to expose a smooth contact surface of the conductive surface.

In some embodiments, the second dielectric layer and the portion of the conductive layer are removed through use of chemical mechanical planarization.

In some embodiments, the second dielectric layer is completely removed, thereby exposing the entire contact surface of the conductive layer.

In some embodiments, the second dielectric layer is deposited to a thickness sufficient to cover the rough upper surface.

In some embodiments, the conductive layer is formed by one-step chemical vapor deposition.

In some embodiments, a crystal phase of the base and the protrusions is consistent.

In some embodiments, a grain size of the conductive layer is substantially in a range of 5 nm to 100 nm.

In some embodiments, the mesas and the blocks collectively define a contact hole.

In some embodiments, the conductive layer is deposited to a thickness sufficient to fill the contact hole.

Another aspect of the present disclosure provides a method for manufacturing a semiconductor structure. The method comprises providing a semiconductor substrate; disposing a first dielectric layer over the semiconductor substrate; forming a contact hole through the first dielectric layer to the semiconductor substrate; forming a barrier layer over a front surface of the first dielectric layer and in the contact hole; forming a conductive layer to cover the barrier layer and fill the contact hole to form a rough upper surface; forming a second dielectric layer over the rough upper surface; and removing the second dielectric layer through use of chemical mechanical planarization until the second dielectric layer is removed.

In some embodiments, the second dielectric layer is removed until a smooth contact surface of the conductive layer is exposed.

In some embodiments, the grain size of the conductive layer is substantially in a range of 5 nm to 100 nm.

With the above-mentioned configurations of a semiconductor structure and the method for manufacturing the semiconductor, the contact surface of the conductive layer is smooth and flat, and therefore suitable for the subsequent lithography and etching processes.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
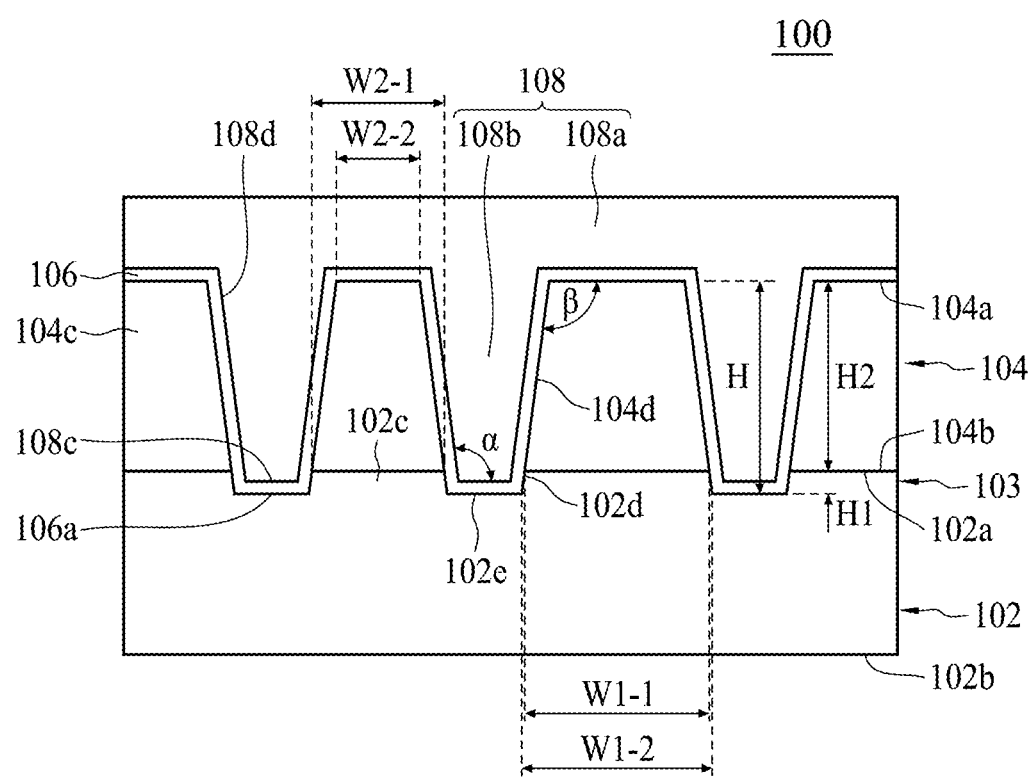
FIG. 1 is a schematic cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor structure in accordance with some embodiments of the present disclosure. Referring to FIG. 1, in some embodiments, the semiconductor structure 100 includes a semiconductor substrate 102 having a plurality of mesas 102c; a first dielectric layer 104 disposed on the semiconductor substrate 102 and having a plurality of blocks 104c disposed over the mesas 102c, respectively; a barrier layer 106 disposed over a first lateral surface 102d of the mesa 102c, a second lateral surface 104d of the block 104c, an upper surface 102e of the semiconductor 102, and a front surface 104a of the first dielectric layer 104; and a conductive layer 108 having a base 108a and a plurality of protrusions 108b extending from the base 108a and disposed between adjacent mesas 102c and blocks 104c, wherein a grain size of the base 108a and the protrusions 108b is consistent.

In some embodiments, the semiconductor substrate 102 includes a first surface 102a and a second surface 102b opposite to the first surface 102a. In some embodiments, the first surface 102a is at a front side of the semiconductor substrate 102, and the second surface 102b is at a back side opposite to the front side of the semiconductor substrate 102. In some embodiments, the semiconductor substrate 102 is a silicon substrate or a silicon wafer.

In some embodiments, the mesa 102c is in a funnel configuration and formed on the upper surface 102e of the semiconductor substrate 102. In some embodiments, the first lateral surface 102d of the mesa 102c extends from the first surface 102a toward the second surface 102b of the semiconductor substrate 102. In some embodiments, the protrusion 108b has a bottom surface 108c substantially parallel to the first surface 102a or the second surface 102b. In some embodiments, the first lateral surface 102d of the semiconductor substrate 102 is disposed at a substantially obtuse angle α relative to the upper surface 102e.

In some embodiments, the mesa 102c has at least two different widths (W1-2, W1-1) along a vertical direction Y. In some embodiments, the mesa 102c includes a first bottom width W1-2 and a first upper width W1-1 different from the first bottom width W1-2, such that the mesa 102c is tapered from the first surface 102a towards the second surface 102b. In some embodiments, the first bottom width W1-2 is substantially greater than the first upper width W1-1, or the first upper width W1-1 is substantially less than the first bottom width W1-2. In some embodiments, a width of the mesa 102c is gradually decreased from the first upper width W1-1 to the first bottom width W1-2 along the vertical direction Y.

In some embodiments, the first dielectric layer 104 includes a front surface 104a and a back surface 104b opposite to the front surface 104a. In some embodiments, the back surface 104b of the first dielectric layer 104 is interfaced with the semiconductor substrate 102. In some embodiments, the first dielectric layer 104 includes oxide.

In some embodiments, the block 104c over the mesa 102c is in a funnel configuration. In some embodiments, the block 104 includes the second lateral surface 104d extending from the front surface 104a toward the back surface 104b. In some embodiments, a slope of the first lateral surface 102d and the second lateral surface 104d is consistent along the vertical direction Y. In some embodiments, the second lateral surface 104d is continuous with the first lateral surface 102d. In some embodiments, the second lateral surface 104d is oriented at an angle β being substantially greater than 90 degrees relative to the front surface 104a of the first dielectric layer 104.

In some embodiments, the block 104c has at least two different widths (W2-1, W2-2) along the vertical direction Y. In some embodiments, the block 104c includes a second bottom width W2-1 and a second upper width W2-2 different from the second bottom width W2-1, such that the block 104c is tapered from the front surface 104a towards the back surface 104b. In some embodiments, the second bottom width W2-1 is substantially greater than the second upper width W2-2, or the second upper width W2-2 is substantially less than the second bottom width W2-1. In some embodiments, the width of the block 104c is gradually decreased from the second bottom width W2-2 to the second upper width W2-1 along the vertical direction Y. In some embodiments, the second upper width W2-2 is substantially less than a height H of the block 104c. In some embodiments, the mesa 102c has a height H1, and the block 104c has a height H2 substantially more than the height H1 of the mesa 102c.

In some embodiments, a bottom surface 106a of the barrier layer 106 is lower than the first surface 102a of the semiconductor substrate 102. In some embodiments, the barrier layer 106 is directly in contact with the first lateral surface 102d of the mesa 102c, a second lateral surface 104d of the block 104c, the upper surface 102e of the semiconductor substrate 102, and the front surface 104a of the dielectric layer 104. In some embodiments, a thickness of the barrier layer 106 disposed over the first lateral surface 102d of the mesa 102c, the second lateral surface 104d of the block 104c, the upper surface 102e of the semiconductor substrate 102, and the front surface 104a of the dielectric layer 104 is consistent. In some embodiments, the barrier layer 106 includes metal materials. In some embodiments, the barrier layer 106 includes titanium or titanium nitride.

In some embodiments, the conductive layer 108 includes tungsten. In some embodiments, the base 108a and the protrusions 108b of the conductive layer 108 are integrally formed. In some embodiments, a bottom surface 108c of the protrusion 108b is in contact with the barrier layer 106 disposed over the upper surface 102e of the semiconductor substrate 102. In some embodiments, the protrusion 108b has a side wall surface 108d in contact with the barrier layer 106. In some embodiments, the conductive layer 108 is formed over the barrier layer 106 by any suitable deposition operation such as chemical vapor deposition (CVD).

Figure 2:
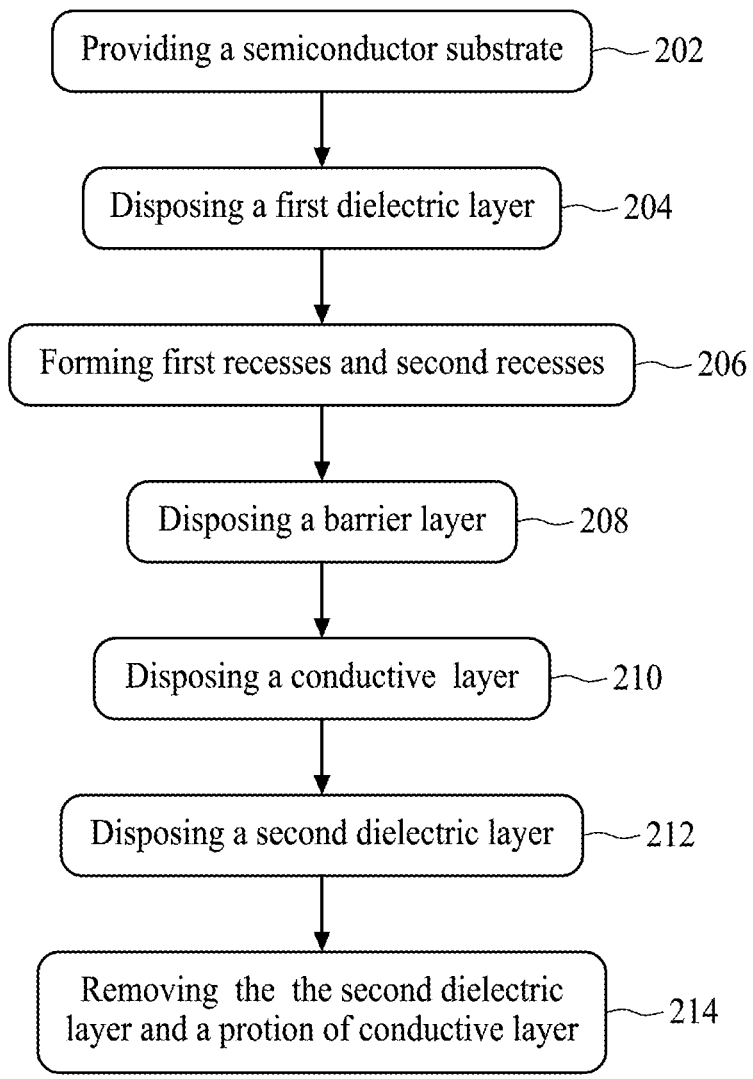
FIG. 2 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method. The method includes a number of operations and the description and illustration are not deemed as a limitation as the sequence of the operations. FIG. 2 shows one embodiment of a method 200 of manufacturing a semiconductor structure. The method 200 includes a number of operations (202, 204, 206, 208, 210, 212, and 214).

Figure 3A:
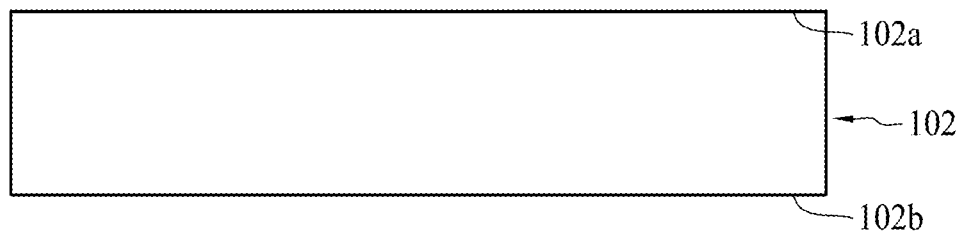
FIGS. 3A to 3H are schematic views of manufacturing a semiconductor structure by a method of FIG. 2 in accordance with some embodiments of the present disclosure.

In operation 202, a semiconductor substrate 102 is provided as shown in FIG. 3A. In some embodiments, the semiconductor substrate 102 is a silicon substrate or a silicon wafer. In some embodiments, the semiconductor substrate 102 includes a first surface 102a and a second surface 102b opposite to the first surface 102a. In some embodiments, the semiconductor substrate 102 has a configuration similar to those described above or illustrated in FIG. 1.

Figure 3B:
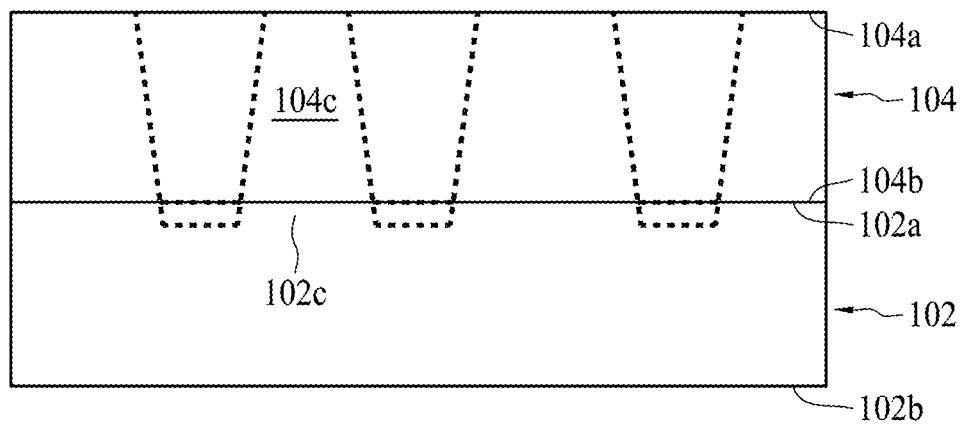

In operation 204, a first dielectric layer 104 is disposed over the semiconductor substrate 102 as shown in FIG. 3B. In some embodiments, the dielectric layer 104 includes a front surface 104a interfaced with the semiconductor substrate 102 and a back surface 104b opposite to the front surface 104a. In some embodiments, the first dielectric layer 104 is formed over the semiconductor substrate 102 by any suitable deposition operation, such as CVD or the like. In some embodiments, the first dielectric layer 104 includes silicon dioxide.

Figure 3C:
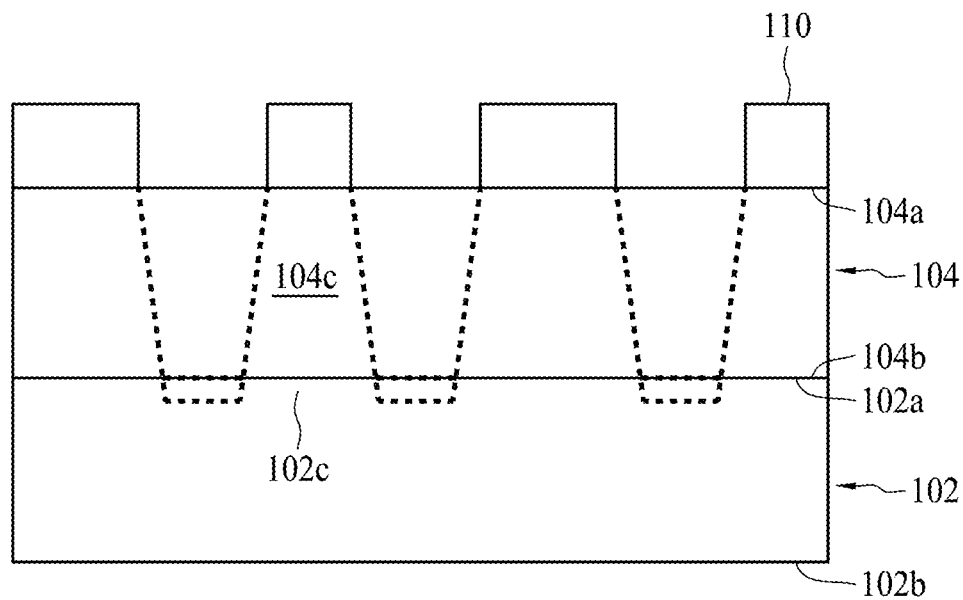
Figure 3D:
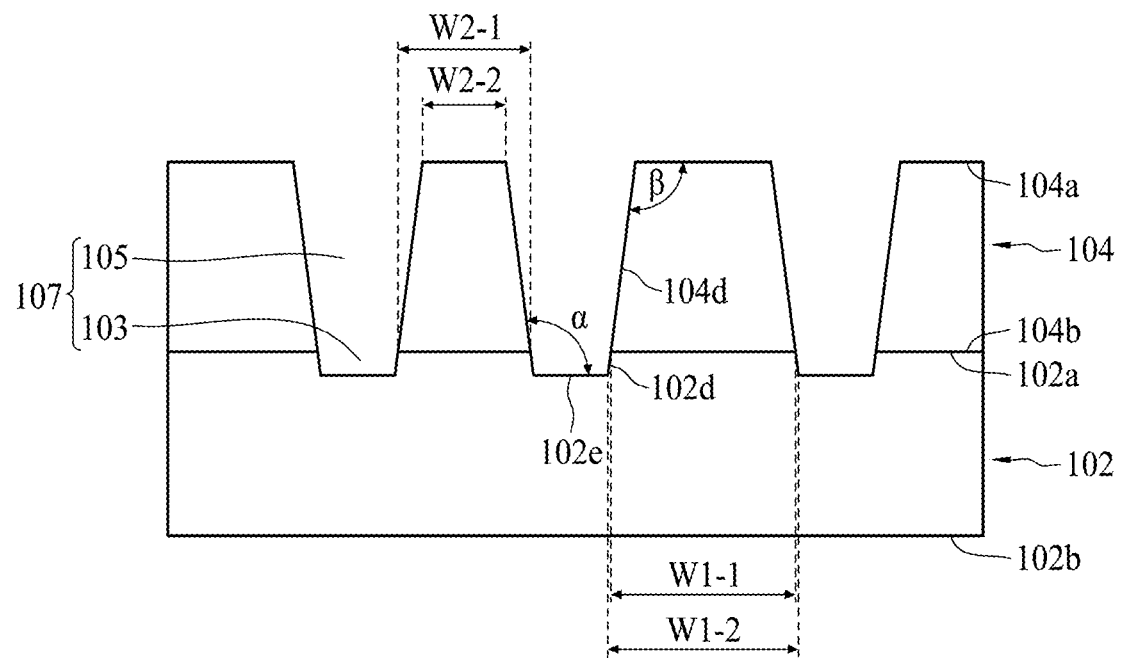

After the deposition of the first dielectric layer 104 over the semiconductor substrate 102, the first dielectric layer 104 and the semiconductor substrate 102 are patterned by removing a predetermined portion thereof to form one or more contact holes 107. In some embodiments, the dielectric layer 104 and the semiconductor layer 102 are patterned by any suitable operation such as photolithography, etching, or the like. In some embodiments, a patterned photoresist 110 is disposed over the first dielectric layer 104 (as shown in FIG. 3C), such that the predetermined portions of the dielectric layer 104 and the semiconductor layer 102 are exposed through the patterned photoresist 110, and next the predetermined portions of the dielectric layer 104 and the semiconductor substrate 102 are removed by any suitable operation such as wet etching or the like to form a plurality of mesas 102c. In some embodiments, a recess 103 is formed by removing the first portion 102c of the semiconductor substrate 102, and a through hole 105 is formed to be in communication with the recess 103 by removing the second portion 104c of the dielectric layer 104, as shown in FIG. 3D.

In some embodiments, the mesas 102c have a first lateral surface 102d. In some embodiments, the first lateral surface 102d is a tapered and sloped sidewall tapering from the first surface 102a into the semiconductor substrate 102. In some embodiments, the semiconductor substrate 102 has a bottom surface 102e substantially parallel to the first surface 102a or the second surface 102b of the semiconductor substrate 102. In some embodiments, the first lateral surface 102d is disposed at an angle α being substantially greater than 90 degrees relative to the upper surface 102e. In some embodiments, the mesa 102c includes a first bottom width W1-2 and a first upper width W1-1 substantially less than the first bottom width W1-2, as shown in FIG. 3D.

In some embodiments, the block 104c has a second lateral surface 104d. In some embodiments, the second lateral surface 104d is tapered and thus includes at least two widths (W2-1, W2-2). In some embodiments, the second lateral surface 104d is a tapered and sloped lateral surface tapering from the front surface 104a through the back surface 104b of the dielectric layer 104. In some embodiments, a slope of the second lateral surface 104d is substantially same as a slope of the first lateral surface 102d. In some embodiments, the block 104c includes a second bottom width W2-1 and a second upper width W2-2 substantially less than the second bottom width W2-1.

Figure 3E:
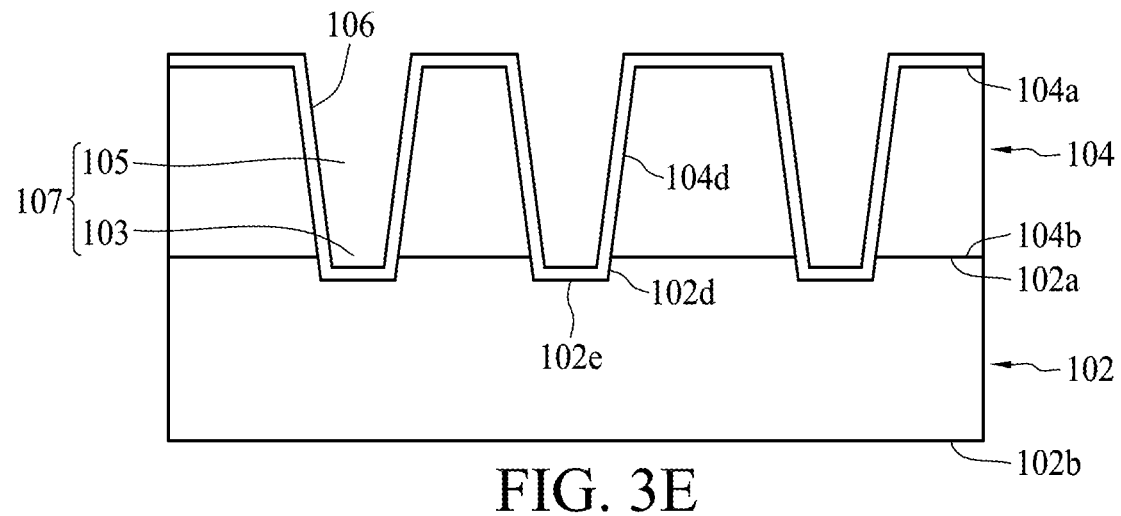

In operation 208, a barrier layer 106 is conformably deposited, covering the front surface 104a of the dielectric layer 104, the first lateral surface 102d of the mesa 102c, the second lateral surface 104d of the blocks 104c, and the upper surface 102e of the semiconductor substrate 102, as shown in FIG. 3E. In some embodiments, the barrier layer 106 is deposited by CVD. In some embodiments, a thickness of the barrier layer 106 disposed over the first lateral surface 102d of the mesa 102c, the second lateral surface 104d of the block 104, the front surface 104a of the dielectric layer 104, and the upper surface 102e of the semiconductor substrate 102 is substantially consistent. In some embodiments, the barrier layer 106 includes titanium, titanium nitride or tungsten nitride. In some embodiments, the barrier layer 106 is disposed in the contact hole 107 using physical vapor deposition (PVD) sputtering process or chemical vapor deposition (CVD) process.

Figure 3F:
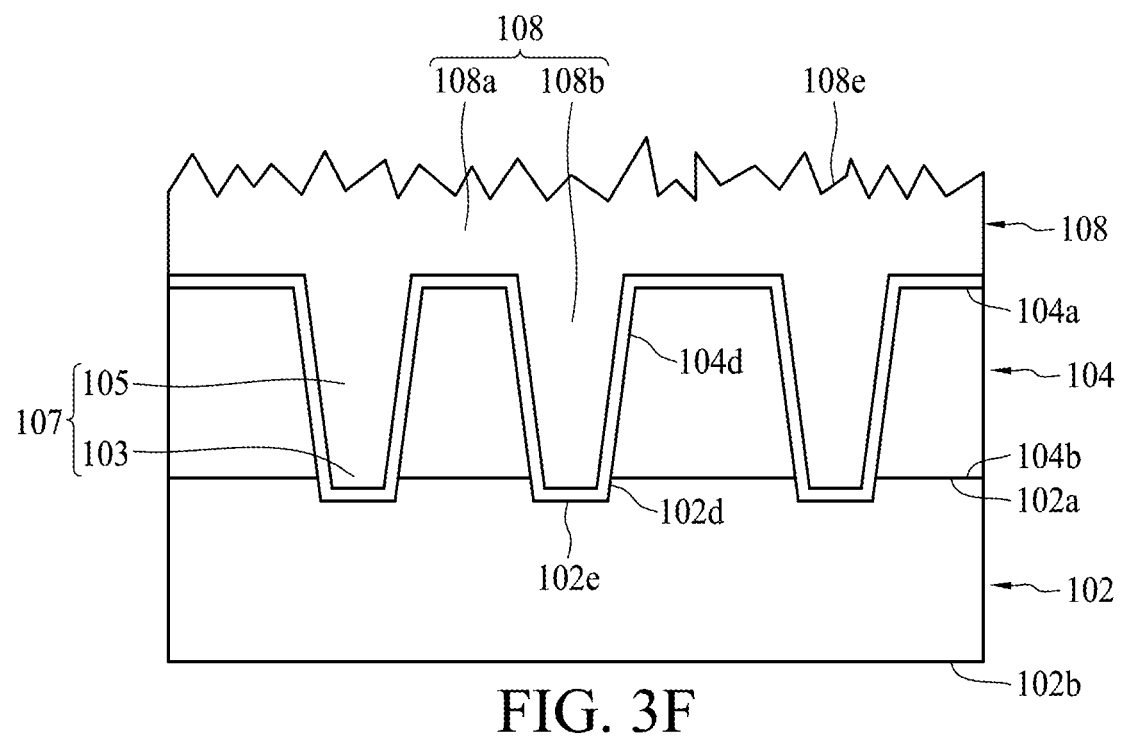

After forming the barrier layer 106, a conductive layer 108 is formed by one-step CVD process. In some embodiments, the conductive layer 108 is deposited to a thickness sufficient to fill the contact hole 107 as shown in FIG. 3F. In some embodiments, the conductive layer 108 includes tungsten. In some embodiments, the conductive layer 108 includes a rough upper surface 108e. In some embodiments, the conductive layer 108 has a base 108a with the rough upper surface 108c, and a plurality of protrusions 108b of the conductive layer 108 extends from a surface of the base 108a opposite to the rough surface 108e. In some embodiments, the base 108a and the protrusions 108b are integrally formed. In some embodiments, the base 108a and the protrusions 108b of the conductive layer 108 are formed by one-step CVD process.

Figure 3G:
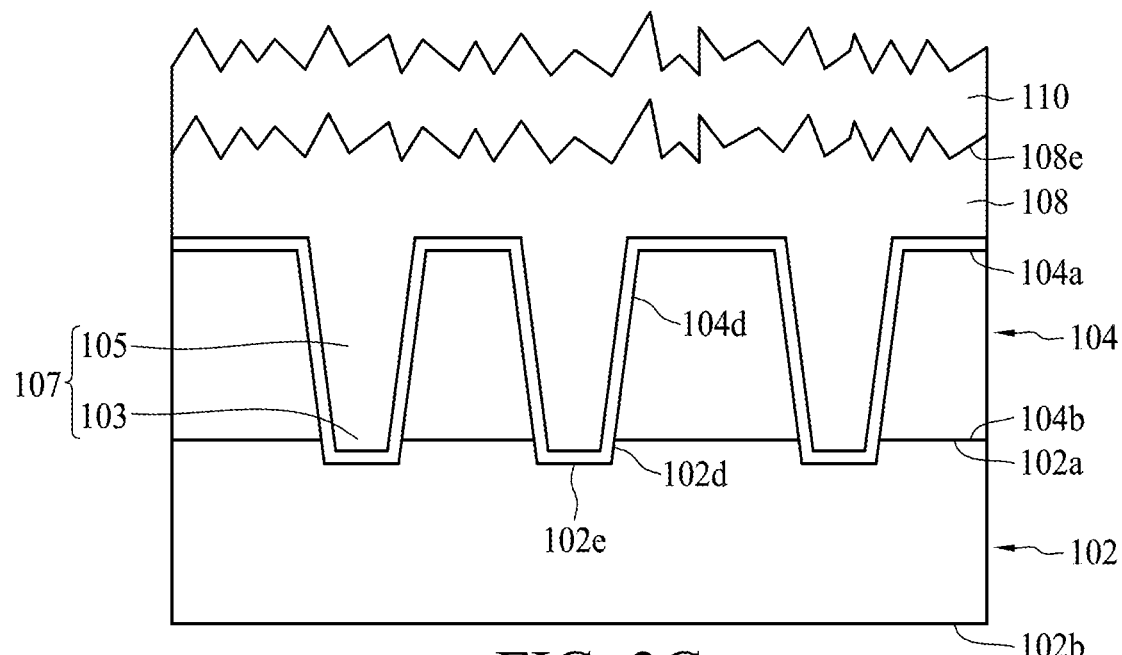
Figure 3H:
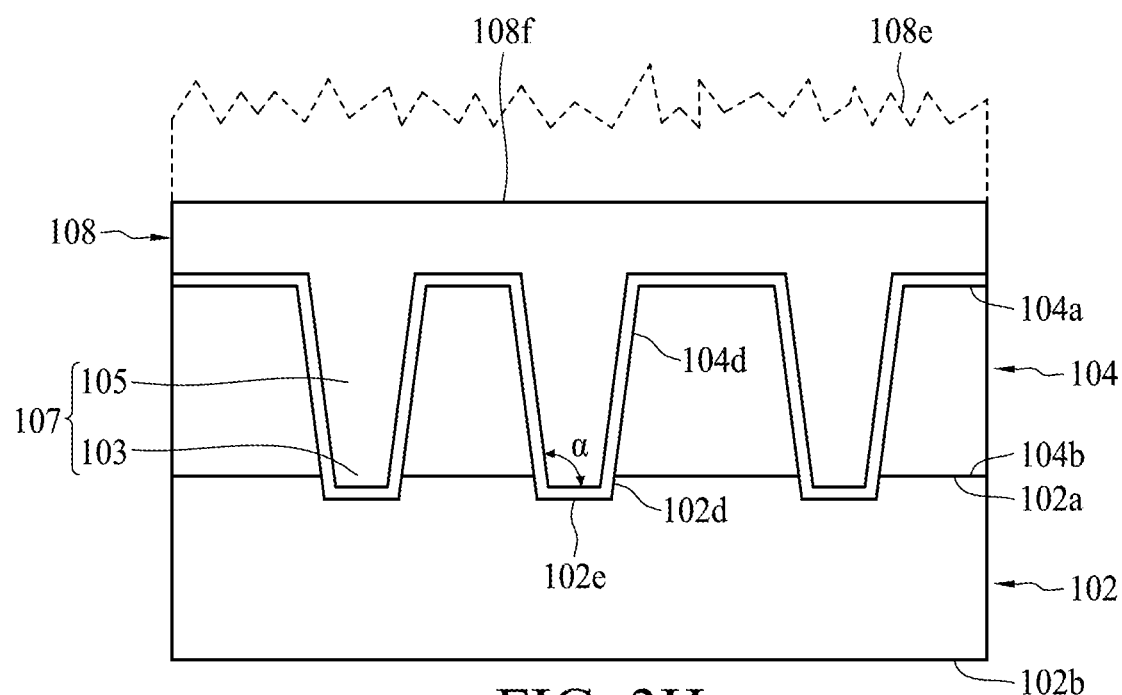

In operation of 212, a second dielectric layer 110 is disposed over the conductive layer 108, as shown in FIG. 3G. In some embodiments, the second dialectic layer 110 is formed over the conductive layer 108 by any suitable deposition operation, such as CVD or the like. In some embodiments, the second dielectric layer 110 is deposited to a thickness sufficient to cover the rough upper surface 108e. In some embodiments, the second dielectric layer 110 includes silicon dioxide or silicon nitride. In some embodiments, the second dielectric layer 110 is a sacrificial layer that is planarized by chemical mechanical planarization (CMP).

After forming the second dielectric layer 110, the second dielectric layer 110 is planarized back to the conductive layer 108, as shown in 3H. In some embodiments, the second dielectric layer 110 is removed via chemical mechanical planarization (CMP) until a smooth contact surface 108f of the conductive layer 108 is exposed. In some embodiments, the smooth contact surface 108f and the rough upper surface 108c are located at different horizontal levels. In some embodiments, a planarized endpoint signal of the CMP process is indicated by an interface of different layers, namely the second dielectric layer 110 and the conductive layer 108.

In conclusion, with the configuration of the semiconductor structure, the conductive layer of the present disclosure can have a smooth contact surface suitable for subsequent interconnect lithography and etching processes. As a result, the necking connection, high resistance, and pattern-toppling problems are solved.

One aspect of the present disclosure provides a semiconductor structure. The semiconductor structure comprises a semiconductor substrate, a dielectric layer, a barrier layer, and a conductive layer. The semiconductor substrate has a plurality of mesas. The dielectric layer is disposed over the semiconductor substrate and has a plurality of blocks disposed over the mesas, respectively. The barrier layer is formed over a first lateral surface of the mesa, a second lateral surface of the block, an upper surface of the semiconductor substrate adjacent to the first lateral surface, and a front surface of the dielectric layer adjacent to the second lateral surface. The conductive layer has a base and a plurality of protrusions extending from the base and in contact with the barrier layer disposed over the upper surface, the first lateral surface, and the second lateral surface, and a grain size of the base and the protrusions is consistent.

One aspect of the present disclosure provides a method for manufacturing a semiconductor structure. The method comprises providing a semiconductor substrate having a plurality of mesas; disposing a first dielectric layer having a plurality of blocks over the mesas, respectively; disposing a barrier layer at least over an upper surface of the semiconductor substrate, a first lateral surface of the mesa, a second lateral surface of the block, and a front surface of the first dielectric layer; disposing a conductive layer having a plurality of protrusions in contact with the upper surface, the first lateral surface, the second lateral surface and a base connected to the protrusions and disposed over the front surface, wherein the base has a rough upper surface; forming a second dielectric layer over the rough upper surface; and removing the second dielectric layer and a portion of the conductive layer to expose a smooth contact surface of the conductive surface.

One aspect of the present disclosure provides a method for manufacturing a semiconductor structure. The method comprises providing a semiconductor substrate; disposing a first dielectric layer over the semiconductor substrate; forming a contact hole through the first dielectric layer to the semiconductor substrate; forming a barrier layer over a front surface of the first dielectric layer and in the contact hole; forming a conductive layer to cover the barrier layer and fill the contact hole to form a rough upper surface; forming a second dielectric layer over the rough upper surface; and removing the second dielectric layer through use of chemical mechanical planarization until the second dielectric layer is removed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a semiconductor substrate having a plurality of mesas;
a dielectric layer disposed over the semiconductor substrate and having a plurality of blocks disposed over the mesas, respectively;
a barrier layer disposed over a first lateral surface of the plurality of mesas, a second lateral surface of the plurality of blocks, an upper surface of the semiconductor substrate adjacent to the first lateral surface, and a front surface of the dielectric layer adjacent to the second lateral surface; and a conductive layer having a base and a plurality of protrusions extending from the base and in contact with the barrier layer disposed over the upper surface, the first lateral surface, and the second lateral surface;

wherein a grain size of the base and the plurality of protrusions is same.

2. The semiconductor structure of claim 1, wherein the grain size of the conductive layer is substantially in a range of 5 nm to 100 nm.

3. The semiconductor substrate of claim 1, wherein the base is in contact with the barrier layer disposed over the front surface.

4. The semiconductor substrate of claim 1, wherein a thickness of the barrier layer disposed over the first lateral surface, the second lateral surface, the upper surface, and the front surface is same.

5. The semiconductor substrate of claim 1, wherein each of the plurality of mesas has a first bottom width and a first upper width less than the first bottom width, and each of the plurality of blocks has a second bottom width and a second upper width less than the second bottom width.

6. The semiconductor substrate of claim 5, wherein a slope of the first lateral surface and the second lateral surface along a vertical direction is same.

7. The semiconductor structure of claim 1, wherein the base and the plurality of protrusions are configured to be formed integrally with identical materials.

8. The semiconductor structure of claim 1, wherein a bottom surface of the barrier layer is lower than a first surface of the semiconductor substrate.

9. The semiconductor structure of claim 1, wherein the conductive layer includes tungsten, the barrier layer includes titanium, and the dielectric layer includes oxide.

10. A method for manufacturing a semiconductor structure, comprising steps of:
   providing a semiconductor substrate having a plurality of mesas;
   disposing a first dielectric layer having a plurality of blocks over the plurality of mesas;
   disposing a barrier layer at least over an upper surface of the semiconductor substrate, a first lateral surface of the plurality of mesas, a second lateral surface of the plurality of blocks, and a front surface of the first dielectric layer;
   disposing a conductive layer having a plurality of protrusions in contact with the upper surface, the first lateral surface, and the second lateral surface and a base connected to the plurality of protrusions and disposed over the front surface, wherein the base has a rough upper surface;
   forming a second dielectric layer over the rough upper surface; and
   removing the second dielectric layer and a portion of the conductive layer to expose a smooth contact surface of the conductive surface.

11. The method of claim 10, wherein the second dielectric layer and the portion of the conductive layer are removed through use of chemical mechanical planarization.

12. The method of claim 10, wherein the second dielectric layer is completely removed, thereby entirely exposing the smooth contact surface of the conductive layer.

13. The method of claim 10, wherein the second dielectric layer is deposited to a thickness sufficient to cover the rough upper surface.

14. The method of claim 10, wherein the conductive layer is formed by one-step chemical vapor deposition.

15. The method of claim 10, wherein a crystal phase of the base and the plurality of protrusions is same.

16. The method of claim 10, wherein a grain size of the conductive layer is substantially in a range of 5 nm to 100 nm.

17. The method of claim 10, wherein the plurality of mesas and the plurality of blocks form a border of a plurality of contact holes.

18. The method of claim 17, wherein the conductive layer is deposited to a thickness sufficient to fill the plurality of contact holes.

19. A method for manufacturing a semiconductor structure, comprising steps of:
   providing a semiconductor substrate;
   disposing a first dielectric layer over the semiconductor substrate;
   forming a contact hole through the first dielectric layer to the semiconductor substrate;
   forming a barrier layer over a front surface of the first dielectric layer and in the contact hole;
   forming a conductive layer to cover the barrier layer and fill the contact hole to form a rough upper surface;
   forming a second dielectric layer over the rough upper surface; and
   removing the second dielectric layer through use of chemical mechanical planarization until the second dielectric layer is removed.

20. The method of claim 19, wherein the second dielectric layer is removed until a smooth contact surface of the conductive layer is exposed.

21. The method of claim 19, wherein a grain size of the conductive layer is substantially in a range of 5 nm to 100 nm.

* * * * *